United States Patent [19]

Nishi

[11] Patent Number: 5,138,176
[45] Date of Patent: Aug. 11, 1992

[54] PROJECTION OPTICAL APPARATUS USING PLURAL WAVELENGTHS OF LIGHT

[75] Inventor: Kenji Nishi, Kawasaki, Japan

[73] Assignee: Nikon Corporation, Tokyo, Japan

[21] Appl. No.: 711,625

[22] Filed: Jun. 6, 1991

[30] Foreign Application Priority Data

Jun. 13, 1990 [JP] Japan .................. 2-154287

[51] Int. Cl.$^5$ ............................................. G01B 11/00
[52] U.S. Cl. ...................................... 250/548; 356/401
[58] Field of Search ............... 250/548; 356/399-401, 356/248-255

[56] References Cited

U.S. PATENT DOCUMENTS

| | | | |
|---|---|---|---|
| 4,251,160 | 2/1981 | Bouwhuis et al. | 356/401 |
| 4,269,505 | 5/1981 | Mayer | 355/62 |
| 4,437,758 | 3/1981 | Suzuki | 356/401 |
| 4,473,293 | 9/1984 | Phillips | 355/53 |
| 4,492,459 | 1/1985 | Omata | 355/43 |
| 4,725,737 | 2/1988 | Nakota et al. | 356/401 |
| 4,780,913 | 11/1988 | Williams | 4/217 |
| 4,795,244 | 1/1989 | Uehara et al. | 356/401 |
| 4,798,962 | 1/1989 | Matsumoto et al. | 250/548 |
| 4,856,905 | 8/1989 | Nishi | 356/401 |
| 4,880,310 | 11/1989 | Nishi | 356/401 |
| 5,004,348 | 4/1991 | Magome | 356/401 |

FOREIGN PATENT DOCUMENTS 63-283129 11/1988 Japan .

Primary Examiner—David C. Nelms
Assistant Examiner—S. Allen
Attorney, Agent, or Firm—Shapiro and Shapiro

[57] ABSTRACT

A projection optical apparatus comprising a projection optical system for projectively focusing a pattern image of a mask under illumination by light of first wavelength onto a sensitive substrate, a stage holding the sensitive substrate, a fiducial plate disposed on the stage, a first mark detector for illuminating light of second wavelength different from the first wavelength, through a first mark area formed on the mask and the projection optical system, onto the sensitive substrate or a second mark area formed on the fiducial plate, then detecting optical information produced from the second mark area, a fourth mark area formed on the sensitive substrate or the fiducial plate and arranged in a predetermined positional relationship relative to the second mark area, a third mark area formed on the mask and arranged in a predetermined positional relationship relative to the first mark area, a second mark detector for illuminating the light of first wavelength onto the fourth mark area through the third mark area and the projection optical system, and then detecting optical information produced from the fourth mark area, under a condition that the first mark detector is detecting the optical information produced from the second mark area, and an error detector for detecting detection errors due to a distortion at respective positions in the view field of the projection optical system where the first mark area and the second mark area are present, based on the detected results by the first mark detector and the second mark detector.

3 Claims, 7 Drawing Sheets

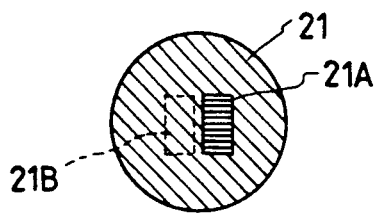
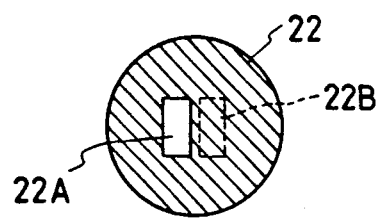
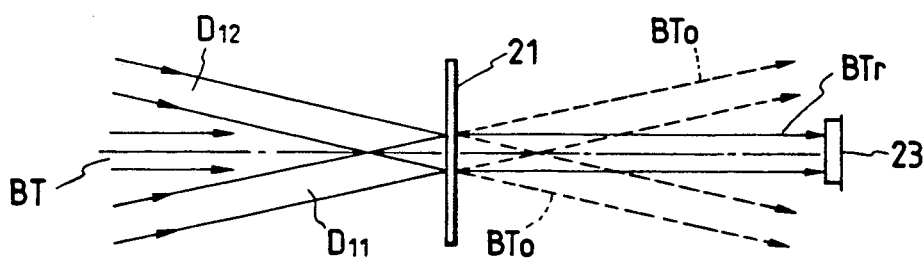
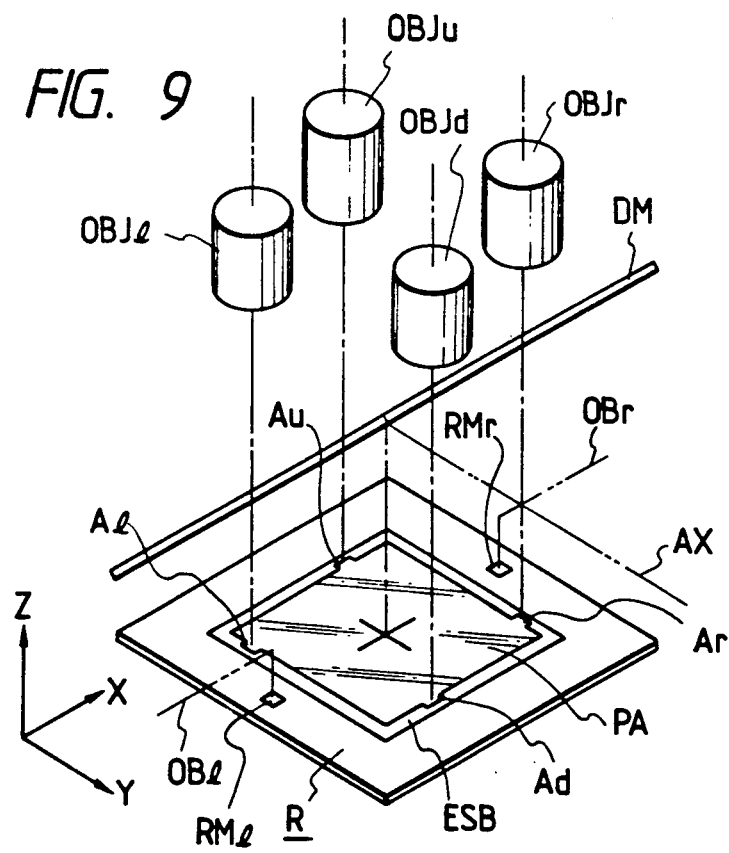

5,138,176

PROJECTION OPTICAL APPARATUS USING PLURAL WAVELENGTHS OF LIGHT

BACKGROUND OF THE INVENTION

1. Field of the Invention

The present invention relates to a projection exposure apparatus used in the lithography process for semiconductor devices, liquid display devices or the like, and more particularly to an alignment apparatus which can reduce an extent of alignment errors attributable to distortion caused by a projection system of the projection exposure apparatus.

2. Related Background Art

Recently, steppers mounting projection lenses of large numerical aperture thereon have been widely used as apparatus for printing a pattern of masks (reticles) on semiconductor wafers with resolution on the order of submicrons.

In such a stepper, a chip pattern (shot area) already formed on the wafer and a reticle pattern newly exposed in superposed relation must be aligned with each other at overall precision less than a fraction of the minimum line width. Of late, therefore, steppers mounting alignment apparatus (sensors) with an ability of higher precision thereon have been researched and developed for practical use.

In the future, it is believed that those steppers which will be primarily used in producing 4 Mbit D-RAMs and 16 Mbit D-RAMs will of necessity have a die-by-die exposure mode using the TTR (Through-The-Reticle) method in which a mark on the reticle and a mark in each shot area on the wafer are successively detected and aligned with each other, followed by printing.

While various techniques have so far been proposed to implement the TTR alignment method, most promising one is a different wavelength TTR alignment method in which the reticle mark and the wafer mark are simultaneously detected by using an illumination light different in wavelength from an exposure light. This type alignment method is advantageous in that because there will not occur a phenomenon for a resist layer on the wafer to strongly absorb the exposure light, the mark can be stably detected even for such wafers as having a resist impregnated with dyes or a multi-layered resist, and the resist in a mark area can be prevented from being exposed or sensitized upon illumination for alignment. Typical techniques (projection exposure apparatus) well known as to implement the different wavelength TTR alignment method are disclosed in U.S. Pat. Nos. 4,251,160, 4,269,505, 4,492,459 or 4,473,293.

In any of those typical projection exposure apparatus, however, an optical system for correcting chromatic aberration of the illumination light having the different wavelength for alignment is disposed between a reticle and a projection lens. Such a correction optical system serves to maintain the reticle mark and the wafer mark in focused relation to each other under the illumination light having the different wavelength, but has suffered from an intrinsic problem that stability is insufficient and precise reproducibility cannot be obtained in the alignment.

In the last several years, a method permitting the different wavelength TTR alignment without using such an correction optical system with less stability and reproducibility has been proposed in U.S. Pat. No. 4,880,310 or Japanese Patent Laid Open No. 63-283129 (corresponding to U.S. application Ser. No. 192,784 filed on May, 10, 1988). In an alignment system disclosed in the above reference, beams for illuminating the reticle mark and the wafer mark are simultaneously focused by a two-focusing element and an object lens on two planes, respectively. One plane is coincident with a pattern plane (mark plane) of the reticle, whereas the other plate is coincident with a wafer conjugate plane in a space away from the reticle pattern plane by a distance corresponding to the amount of axial (on-axis) chromatic aberration of the projection lens.

Adopting the above disclosed method eliminates the need of providing an optical element, other than the projection lens, in an optical path for alignment between the reticle and the wafer, and permits the TTR alignment as if the exposure light is used.

However, the latest projection lens is corrected in its various aberrations satisfactorily for only the exposure light, but exhibits both axial chromatic aberration and magnification chromatic aberration. Even if use of the two-focusing element succeeds in correcting the axial chromatic aberration, the magnification chromatic aberration cannot be always corrected satisfactorily, thereby requiring it to remove an alignment error (offset) attributable to the magnification chromatic aberration by some method. For this reason, a technique of coping with the magnification chromatic aberration (distortion) has been proposed in U.S. Pat. Nos. 4,780,913 and 4,856,905, by way of example. Of them, U.S. Pat. No. 4,780,913 discloses such a technique that a reference mark capable of exiting light rays at two wavelengths, i.e., the exposure light at one wavelength and the illumination light for alignment at a different wavelength, is provided on a wafer stage and moved on the image plane side of a projection lens to scan a retroprojected image of the reference mark on the reticle side for determining a position of the reticle mark, thereby preparing a distortion map in the view field of the projection lens beforehand. On the other hand, U.S. Pat. No. 4,856,905 discloses such a technique that the exposure light is introduced in the form of a beam to an illumination beam transmitting system (comprising a scanner mirror, two-focusing element, object lens, etc.) of a different wavelength TTR alignment system, allowing an illumination beam at the different wavelength and an illumination beam at the wavelength of the exposure light to be scanned simultaneously, whereby data of light information are photoelectrically detected from respective reference marks on the reticle mark and the wafer stage to determine a distortion at the alignment point based on differences in the amount of position deviation detected for each wavelength of the beam.

The aforementioned prior arts for coping with the magnification chromatic aberration are arranged so that both the illumination light for alignment and the illumination light for exposure pass through the same position in the view field of the projection lens. Specifically, in U.S. Pat. No. 4,780,913, two types of illumination light are required to be introduced to the rear side of the same reference mark through optical fibers or the like. In U.S. Pat. No. 4,856,905, the illumination light for exposure is required to be introduced to the different wavelength TTR alignment system.

That structure has suffered from problems as follows. An arrangement of the alignment optical system is complicated, which leads to a difficulty in manufacture that a severer level is required in the performance of constituent optical elements (particularly, achromatism). In addition, it is difficult to make a match between various conditions of the optical system (such as a sigma value, number of aperture and tele-centricity) under the illumination light for exposure and various conditions of the optical system under the illumination light for alignment, thus rendering it hard to know a precise distortion error enough for practical use. Moreover, an actual exposure apparatus (stepper) of even 1/5 reduction type is designed so as to accommodate an exposure of a wide field (view field) on the order of 15×15 mm to 20×20 mm. But, exposure areas of reticle patterns employed by stepper users are versatile in size, and the position of the alignment mark in the projection field is naturally changed variously depending on the size. Because the distortion amount of the projection lens with respect to an ideal lattice under the illumination light for exposure is also changed depending on change in the alignment position, there has been another problem that the difference between distortion characteristics under the illumination light for alignment and the illumination light for exposure, which has been determined at only the alignment position, is not enough for satisfactory correction, taking into account the fact that the reticle pattern must be superposed with the shot area over the entire wide field.

Further, the apparatus disclosed in the above cited U.S. Pat. No. 4,856,905 has a specific problem as follows. Where the illumination light for exposure and the illumination light for alignment are separated from each other depending on their ranges of wavelength by a dichroic mirror obliquely disposed above the reticle at an angle of 45°, if transmissivity (or reflectivity) of the dichroic mirror for the illumination light for alignment is set very high, the illumination light for exposure to be detected by the different wavelength TTR alignment system could not pass through (or be reflected by) the TTR alignment system in its large part, making is difficult to detect the mark. On the other hand, if wavelength characteristics of the dichroic mirror are selected to give some degree of transmissivity (or reflectivity) to the illumination light for exposure as well, the amount or intensity of light directing toward the reticle from an exposure light illuminating system during the exposure would now be reduced correspondingly.

SUMMARY OF THE INVENTION

The present invention has been achieved in view of the various problems as stated above, and has for its object to provide a projection optical apparatus equipped with a different wavelength TTR alignment system which can detect and correct an alignment offset attributable to, particularly, a distortion with high precision.

To achieve the above problem, with the present invention, a fiducial mark (fourth mark area) to be detected under an illumination light for exposure (light of first wavelength characteristic) and a fiducial mark (second mark area) to be detected under an illumination light for alignment (a light of second wavelength characteristic) are arranged on a fiducial plate to be positionally separate from each other, the fiducial plate being fixed on a stage on which a sensitive plate such as a wafer is rested. Furthermore, a reticle mark (third mark area) to be detected under the illumination light for exposure and a reticle mark (first mark area) to be detected under the illumination light for alignment are disposed on a reticle (mask) respectively corresponding to the separate positions of the associated fiducial marks on the fiducial plate. A different wavelength TTR alignment system (first mark detection means) for detecting the reticle mark (first mark area) and the fiducial mark (second mark area) under the illumination light for alignment, and an exposure wavelength TTR alignment system (second mark detection means) for detecting the reticle mark (third mark area) and the fiducial mark (fourth mark area) under the illumination light for exposure are arranged as independent optical systems of each other and to be capable of detecting the corresponding marks simultaneously by both the TTR alignment systems.

FIG. 1 shows a schematic configuration of a stepper for explaining the principles of the present invention. A circuit pattern area PA on a reticle R is projected to one shot area on a wafer (not shown in FIG. 1) by a projection lens PL which is tele-centric on both sides. Around the pattern area PA on the reticle R, there are provided marks Au, Al to be respectively detected by TTR alignment systems $AO_{2x}$, $AO_{2y}$ each using an illumination light of different wavelength ($\lambda_{2x}$). The mark Au to be detected by the alignment system $AO_{2x}$ is used for alignment in the X direction, whereas the mark Al to be detected by the alignment system $AO_{2y}$ is used for alignment in the Y direction. These marks Au and Al are formed midway one side extending in the X direction of the pattern area PA and another side extending in the Y direction thereof, respectively. The different wavelength TTR alignment systems $AO_{2x}$, $AO_{2y}$ are each able to move an alignment position in the X and Y directions. Further, at a location outside the pattern area PA on the reticle R, but within the view field of the projection lens PL, there is formed a mark RMr to be detected by a TTR alignment system $AO_1$ using an illumination light of exposure wavelength $\lambda_1$. The position of the mark RMr is always fixedly located regardless of reticles having different sizes of the pattern area PA. Then, the exposure light for uniformly illuminating the pattern area PA during the exposure is set not to be shielded by a distal end portion of the TTR alignment system $AO_1$. Accordingly, even in the case where a variety of reticles having different sizes of the pattern area PA are exchanged from one to another, the TTR alignment system $AO_1$ is not required to be moved and can be held fixed on the apparatus.

Meanwhile, below the projection lens PL, there is located a fiducial (reference mark) plate FP fixedly disposed on wafer stage. The surface of the fiducial plate FP is conjugate to the reticle R with respect to the projection lens PL under the exposure wavelength. A fiducial mark FMr to be detected at the same time as the mark RMr on the reticle R and fiducial marks Fu, Fl to be detected at the same time as the marks Au, Al on the reticle R, respectively, are formed on the surface of the fiducial plate FP by etching of a chromium layer, etc. The mark Fu corresponds to the mark Au and is formed in a wide area enough to cover any positions to which the mark Au is movable on the reticle R. This also equally applies to the mark Fl.

Then, in the configuration of FIG. 1, when the fiducial plate FP is positioned such that the mark RMr (the third mark area) and the fiducial mark FMr (the fourth mark area) are simultaneously detected by the TTR alignment system $AO_1$, the mark Au (the first mark area) and the fiducial mark Fu (the second mark area) are simultaneously detected by the TTR alignment system $AO_1$, for example. Since the positional relationship between the fiducial marks FMr and Fu on the fiducial plate FP, as well as the positional relationship between the marks RMr and Au on the reticle R are precisely known in advance, a difference between the amount of alignment error detected by the different wavelength TTR alignment system $AO_{2X}$ and the amount of alignment error detected by the exposure wavelength TTR alignment system $AO_1$ represents an offset amount in the X direction attributable to chromatic aberration at the position of the mark Au.

By storing this offset amount, therefore, the error can be easily corrected when the reticle R and the wafer are later aligned with each other by using the TTR alignment system $AO_{2X}$.

In this way, with the different wavelength TTR alignment system and the exposure wavelength TTR alignment system being arranged independently of each other, but to carry out the simultaneous mark detecting operation, an influence of distortion can be corrected more strictly and reliably.

BRIEF DESCRIPTION OF THE DRAWINGS

FIG. 7A is a plan view showing a fiducial grating for a reticle;

FIG. 7B is a plan view showing a field iris for a wafer;

FIG. 8 is a view for explaining an optical system of the different wavelength TTR alignment system;

FIG. 9 is a perspective view showing a practical arrangement of the different wavelength TTR alignment system and an exposure wavelength TTR alignment system;

DESCRIPTION OF THE PREFERRED EMBODIMENTS

Hereinafter, a configuration of a stepper according to one preferred embodiment of the present invention will be described with reference to FIGS. 2 to 11.

While this embodiment employs a different wavelength TTR alignment system of two-beam interference type using gratings, as disclosed in the above cited U.S. application Ser. No. 192,784, the present invention is also applicable to other types of alignment system (including an image detecting method or spot scanning method) exactly in the same manner.

Figure 2:
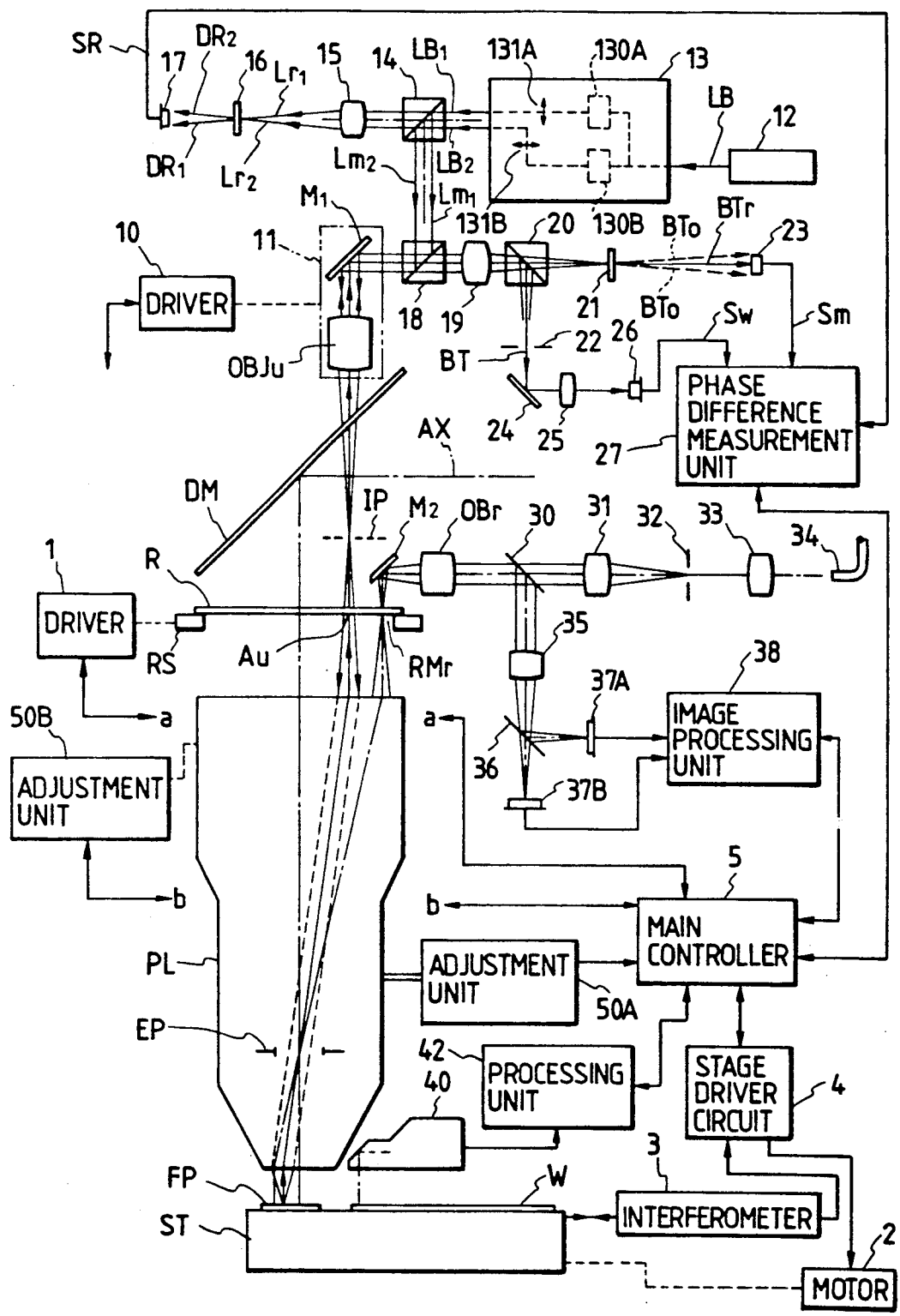
FIG. 2 is a view showing a detailed configuration of the stepper according to the embodiment of the present invention.

In FIG. 2, a dichroic mirror DM is obliquely disposed above a reticle R at an angle of 45° to bend an optical axis AX of a projection lens PL at a right angle or horizontally on the drawing. The dichroic mirror DM reflects an exposure light propagating along the optical axis AX from an illumination system for exposure (not shown) at a percentage greater than about 90% so that the reflected light is directed toward a pattern area PA on a reticle R. The reticle R is held on a reticle stage RS which is finely movable in the two dimensional directions (X, Y, $\theta$ directions), the reticle stage RS being positioned by a driver 1. On the other hand, an XY stage ST for holding a wafer W and a fiducial plate FP thereon is disposed below the projection lens PL and movable in the X and Y directions by a motor 2, the coordinate position of the stage ST being successively measured by a laser interferometer 3. Positioning of the stage ST is performed by a stage driver circuit 4 which monitors the measured value of the interferometer 3 and drives the motor 2. The stage driver circuit 4 controls the movement and positioning of the stage ST based on a command from a main controller 5. The main controller 5 also supervises control of the driver 1.

Figure 1:
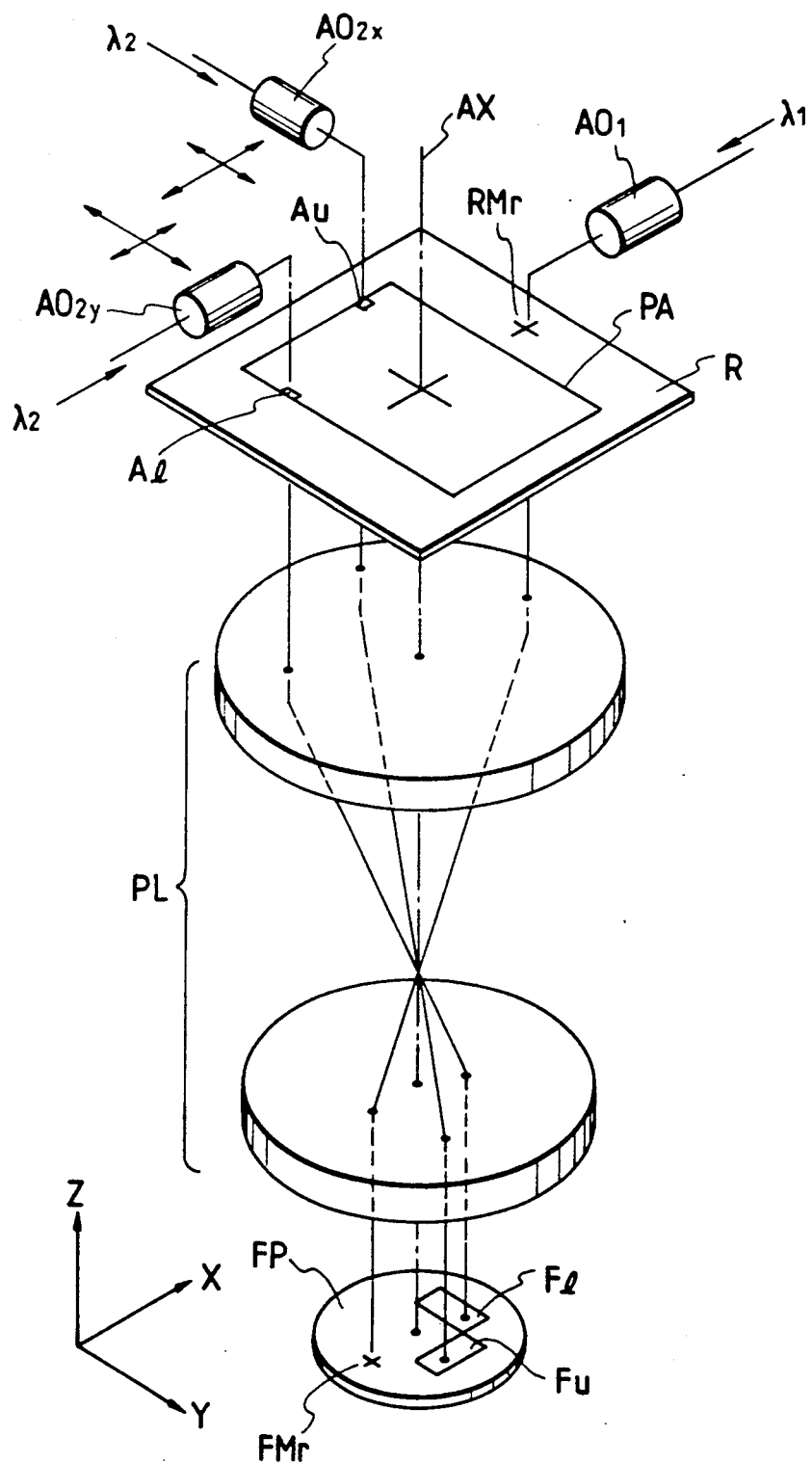
FIG. 1 is a perspective view of a configuration for explaining the principles of a stepper according to an embodiment of the present invention.

While a different wavelength TTR alignment system of the this embodiment is constructed above the dichroic mirror DM in two to four eyes (representing the number of object lenses), FIG. 2 shows only one eye, i.e., the system corresponding to $AO_{2X}$ in FIG. 1.

A tele-centric object lens OBJu and a mirror $M_1$ are held by a holder 11 which is movable in the X and Y directions by the driver 10 together with the object lens and the mirror.

The object lens OBJu is arranged to be out of interference with the dichroic mirror DM and to have its optical axis vertical to the reticle R.

An illumination light for the different wavelength alignment is emitted in the form of a linearly polarized beam LB from a laser light source 12 such as a helium-neon or argon ion laser, and enters a two-beam forming frequency shifter unit 13. In the unit 13, there are disposed means for dividing the beam LB into two beams, two AOMs (acousto-optic modulators) 130A, 130B for respectively applying high-frequency modulations (frequency shifts) to the divided two beams, small lenses 131A, 131B for focusing the respective frequency shifted beams, and so on. The AOM 130A is driven at frequency $f_1$ (for example, 80 MHz) and a 1st order diffracted beam $LB_1$ therefrom is taken out through the small lens 131A, whereas the AOM 130B is driven at frequency $f_2$ (for example, 80.03 MHz) and a 1st order diffracted beam $LB_2$ therefrom is taken out through the small lens 131B. The two beams $LB_1$, $LB_2$ have their principal rays set parallel to the optical axis of the alignment system and symmetrical about the optical axis, and are each divided by a beam splitter 14 into two beams. A pair of divided beams $L_{r1}$, $L_{r2}$ having passed through the beam splitter 14 are converted by condenser lens (inverse Fourier transform lens) 15 into fluxes of parallel light which cross each other in its focus plane on the rear or downstream side. A reference grating 16 is disposed in the rear focus plane so as to produce an interference fringe with the pitch depending on the crossing angle and wavelength of the two beams $L_{r1}$, $L_{r2}$. The interference fringe moves over the reference grating 16 in one direction at a speed depending on a frequency difference $\Delta f$ (30 KHz) between the two beams $L_{r1}$ and $L_{r2}$. On the reference grating 16, there is provided a transmission type diffraction grating with the pitch being equal to the pitch of the interference fringe. Accordingly, the reference grating 16 produces an interference light $DR_1$ between a 0th order light of the beam $L_{r1}$ and a 1st order light created from the beam $L_{r2}$, as well as an interference light $DR_2$ between a 0th order light of the beam $L_{r2}$ and a 1st order light created from the beam $L_{r1}$, the amounts of the interference lights $DR_1$, $DR_2$ being detected by a photoelectric element 17. Here, the intensity of the interference lights $DR_1$, $DR_2$ is changed sinusoidally at the frequency difference $\Delta f$ (30 KHz), i.e., beat frequency, so that an output signal SR from the photoelectric element 17 becomes an AC signal of 30 KHz. This signal SR is used as a reference signal for phase comparison in the alignment process.

Figure 3:
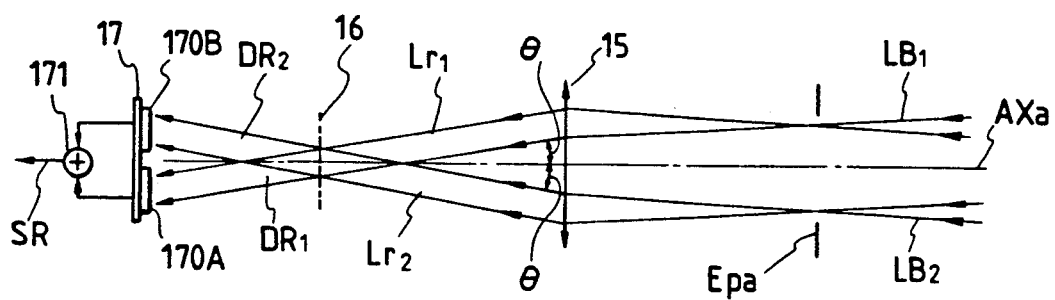
FIGS. 3 and 4 are views for explaining an optical system of a different wavelength TTR alignment system.

FIG. 3 is a view showing optical paths of the beams $LB_1$, $LB_2$ and behaviors thereof in detail from the lens 15 to the photoelectric element 17. First, the two beams $LB_1$, $LB_2$ are respectively condensed by the action of the small lenses 131A, 131B in a plane EPa to become beam waists. The plane EPa is a Fourier plane in coincidence with a focus plane of the lens 15 on the front or upstream side, so that the beams $L_{r1}$, $L_{r2}$ propagate from the lens 15 in the form of parallel light fluxes to cross each other on the reference grating 16. Respective positions of the beams $L_{r1}$, $L_{r2}$ in the plane EPa are set to be symmetrical about the optical axis AXa of the alignment system, and the distance of each beam position from the optical axis AXa determines an incident angle $\theta$ of the beams $L_{r1}$, $L_{r2}$ with respect to the reference grating 16.

Following the general analytical theory, a diffraction angle $\alpha$ of $\pm$1st order diffracted lights with respect to a 0th order light, produced by a coherent beam of wavelength $\lambda$ impinging upon a one-dimensional grating with a pitch Pg, is uniquely determined by $\sin \alpha = \lambda/Pg$. Therefore, by setting the pitch Pg of the reference grating 16 such that the diffraction angle $\alpha$ of the 1st order diffracted light becomes just $2\theta$ with respect to the 0th order light of the beam $L_{r1}$ (i.e., the interference light $DR_1$), the 1st order diffracted light of the beam $L_{r1}$ produces coaxially with the 0th order light of the beam $L_{r2}$ (i.e., the interference light $DR_2$).

At this time, the pitch of the interference fringe produced on the reference grating 16 is equal to the grating pitch Pg.

The photoelectric element 17 has light receiving surfaces 170A, 170B for separately receiving the two interference beams $DR_1$, $DR_2$. Respective photoelectric signals from the light receiving surfaces 170A, 170B are added to each other by an adder 171 in an analog manner and the resulting sum is outputted as the reference signal SR.

Returning again to the explanation of FIG. 2, two beams $L_{m1}$, $L_{m2}$ reflected by the beam splitter 14 are further reflected by another beam splitter 18 to enter the object lens OBJu through the mirror $M_1$. The object lens OBJu converts the two beams $L_{m1}$, $L_{m2}$ into respective fluxes of parallel light which cross each other in a spatial plane IP. The plane IP is spaced from the reticle R by a distance corresponding to the amount $\Delta L$ of axial chromatic aberration in the direction of the optical axis AX, and is conjugate to the wafer W or the fiducial plate FP under the wavelength ($\lambda_2$) of the illumination beam LB for alignment. The two beams $L_{m1}$, $L_{m2}$ having crossed each other in the plane IP are spaced from each other in a mark area Au on the reticle R and, after becoming beam waists in a pupil EP of the projection lens PL, they cross each other again on the fiducial plate FP (or the wafer W) in the form of parallel light fluxes.

Figure 4:
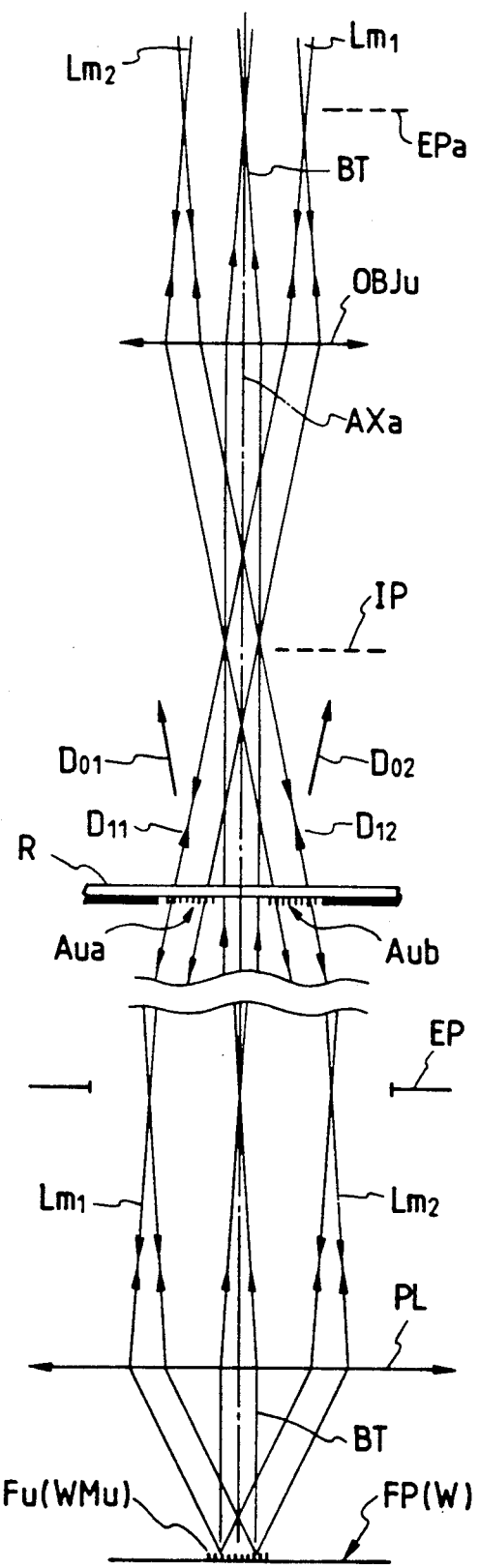

FIG. 4 is a view of optical paths showing behavior of the beams $L_{m1}$, $L_{m2}$. The focus plane of the object lens OBJu on the front or upstream side is coincident with the plane EPa shown in FIG. 3, so that the two beams $L_{m1}$, $L_{m2}$ turn to beam waists in the plane EPa. The two beams $L_{m1}$, $L_{m2}$ exiting from the object lens OBJu become fluxes of parallel light and cross each other in the plane IP, i.e., in the rear focal plane of the object lens OBJu. Thereafter, the beam $L_{m1}$ illuminates a reticle grating mark Aua in the mark area Au on the reticle R and also passes through a transparent portion of the mark area Au, followed by entering the projection lens PL. Then, the beam $L_{m1}$ becomes a flux of parallel light again which obliquely illuminates a grating in a mark area Fu on the fiducial plate FP (or the wafer W).

Likewise, the beam $L_{m2}$ illuminates a reticle grating mark Aub in the mark area Au on the reticle R and also passes through a transparent portion of the mark area Au, following which the beam $L_{m2}$ obliquely illuminates the grating in the mark area Fu on the fiducial plate FP (or the wafer W) in a direction symmetrical to the beam $L_{m1}$.

As shown in FIG. 4, the two beams $L_{m1}$, $L_{m2}$ become fluxes of converging light in a pupil space (comprising the optical path between the object lens OBJu and the small lenses 131A, 131B and the interior of the projection lens PL) with their principal rays being parallel to the optical axis AXa, and then become fluxes of parallel light in an image space (comprising the optical path between the object lens OBJu and the projection lens PL and the optical path between the projection lens PL and the fiducial plate FP or the wafer W) with their principal rays crossing each other in a focal plane (image plane) of the projection lens PL.

Figure 5:
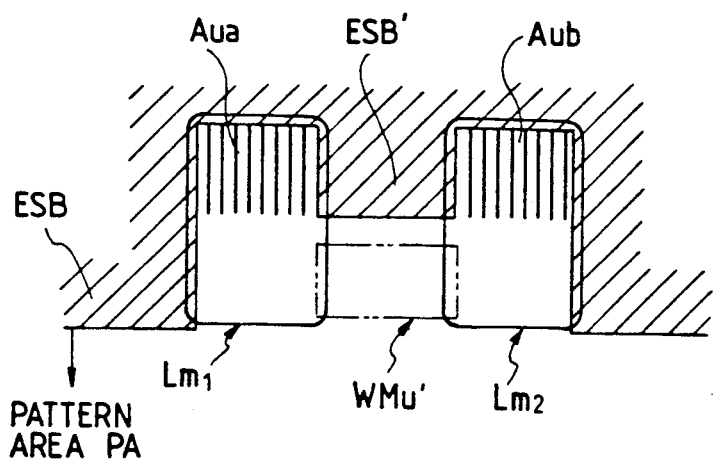
FIG. 5 is a plan view showing an arrangement of reticle grating marks.
Figure 6:
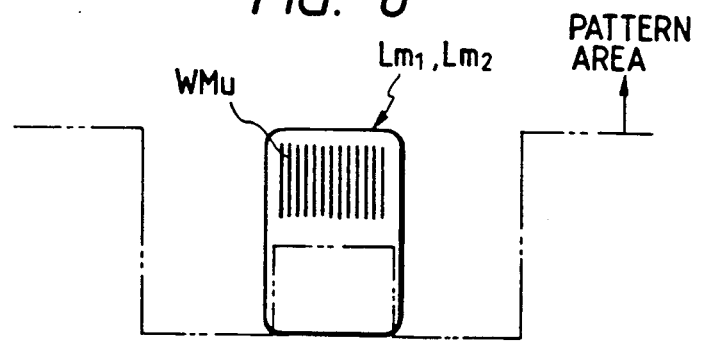
FIG. 6 is a plan view showing an arrangement of a wafer grating marks.

From the mark area Fu on the fiducial plate FP, an interference light BT is vertically produced in the upward direction. The interference light BT is resulted from interference between a 1st order diffracted light vertically produced from the mark Fu upon irradiation of the beam $L_{m1}$ and a 1st order diffracted light vertically produced from the mark Fu upon irradiation of the beam $L_{m2}$, the interference light BT being a flux of parallel light in the image space. After converging into a beam waist at the center of the pupil EP of the projection lens PL, the interference light BT reversely propagates along the optical axis Axa of the object lens OBJu while passing through a transparent portion (between the marks Aua and Aub) at the center of the mark area on the reticle R in the form of a parallel light flux. The interference light BT converges again into a beam waist at the center of the front focal plane of the object lens PL, that is, the plane EPa conjugate to the pupil EP of the projection lens PL, followed by returning toward a light receiving system while passing through the mirror $M_1$ and the beam splitter 18 in this order as shown in FIG. 2. Structure of the mark area Au on the reticle R will now be explained with reference to FIGS. 5 and 6. As shown in FIG. 5, a light shielding band ESB of constant width is formed all around the circuit pattern area PA on the reticle R. At a part of the light shielding band ESB, there are arranged two grating marks Aua, Aub with a light shielding portion ESB' therebetween. The marks Aua and Aub have the same pitch, and their width in a direction perpendicular to the pitch direction is set about a half the total width of the transparent window. The width of the light shielding portion ESB' is also set about a half the total width of the transparent window. A grating mark WMu on the wafer W is located in a portion WMu' in the mark area under the wavelength for alignment. The two beams $L_{m1}$, $L_{m2}$ respectively illuminate the grating marks Aua and Aub in a rectangular shape. Meanwhile, as shown in FIG. 6, the beam $L_{m1}$ having passed through the transparent portion adjacent to the mark Aua on the same side as the pattern area PA illuminates the wafer mark WMu, and the beam $L_{m2}$ having passed through the transparent portion adjacent to the mark Aub on the same side as the pattern area PA also illuminates the wafer mark WMu. The interference light BT vertically produced from the mark WMu returns to the object lens OBJu after passing through the portion WMu' in the plane of the reticle R as shown in FIG. 6.

When the beams $L_{m1}$, $L_{m2}$ respectively illuminate the reticle grating marks Aua, Aub in FIG. 4, higher order diffracted lights are also reflected along with 0th order lights $D_{01}$, $D_{02}$. In this embodiment, the pitch of the mark Aua (Aub) is set so that assuming an incident angle of the beam $L_{m1}$ ($L_{m2}$) upon the grating mark Aua (Aub) be $\theta'$, the diffraction angle of the 1st order diffracted light with respect to the 0th order light $D_{01}$ ($D_{02}$) becomes exactly $2\theta'$. With such setting, the grating mark Aua produces a 1st order diffracted light $D_{11}$ (with the frequency shift $f_1$) propagating along the optical path of the beam $L_{m1}$ exactly in a reversed direction, whereas the grating mark Aub produces a 1st order diffracted light $D_{12}$ (with the frequency shift $f_2$) propagating along the optical path of the beam $L_{m2}$ exactly in a reversed direction. Accordingly, along with the interference light BT, the 1st order diffracted beams $D_{11}$, $D_{12}$ are also returned toward the light receiving system through the object lens OBJu. Referring to FIG. 2 again, the interference light BT and the 1st order diffracted lights $D_{11}$, $D_{12}$ pass through the beam splitter 18 and enter a condensing lens system 19. The lens system 19 is an inverse Fourier transform lens which converts all of the interference light BT and the 1st order diffracted lights $D_{11}$, $D_{12}$ into fluxes of parallel light and causes them to cross each other in a focal plane (image conjugate plane) of the lens system 19. The three beams having passed through the lens system 19 are each divided into two parts by a beam splitter 20. Respective parts having passed through the beam splitter 20 reach a fiducial grating plate 21 for the reticle, whereas the reflected parts reach a field iris 22. The fiducial grating plate 21 and the field iris 22 are both conjugate to the plate IP (i.e., the plane conjugate to the fiducial plate FP or the wafer W). Accordingly, at the fiducial grating plate 21, the 1st order diffracted lights $D_{11}$, $D_{12}$ cross each other to produce an interference fringe in the crossed area. The resulting interference fringe of course flows or drifts one-dimensionally at the beat frequency $\Delta f$ (30 KHz). As shown in FIG. 7A, therefore, a transmission type diffraction grating 21A is provided on the fiducial grating plate 21 covered with a chromium layer, and an interference light BTr between two diffracted lights coaxially produced from the grating 21A. This behavior will now be described by referring to FIG. 8. Because of meeting an image conjugate relation, the fiducial grating plate 21 is conjugate to the plane IP and the wafer mark WMu (or the surface of the fiducial plate FP) so that the interference light BT also impinges upon the fiducial grating plate 21 in addition to the 1st order diffracted lights $D_{11}$, $D_{12}$. However, since the wafer mark WMu and the reticle marks Aua, Aub are arranged in the X-Y plane to be shifted laterally, the interference light BT returns to a portion (light shielding portion) 21B on the fiducial grating plate 21, which portion is adjacent to the grating 21A where the two 1st order diffracted lights $D_{11}$, $D_{12}$ cross each other, as shown in FIG. 7A.

Accordingly, by just setting the position and size of the grating 21A on the fiducial grating plate 21 in match with the size of the mark Aua or Aub, the interference light BT from the wafer mark WMu can be shielded.

Respective 0th order lights BTo of the 1st order diffracted lights $D_{11}$, $D_{12}$ illuminating the grating 21A on the fiducial grating plate 21 propagate so as to deviate from a photoelectric element 23, and only the interference light BTr between two 1st order diffracted lights vertically produced from the grating 21A is received by the photoelectric element 23. This technique is the same as the case of taking out the interference light BT from the wafer mark WMu as shown in FIG. 4. In either case, the grating pitch of the wafer mark WMu or the grating 21A is set exactly two times the pitch of the interference fringe produced thereon.

The intensity of the interference light BTr thus received by the photoelectric element 23 is changed sinusoidally at the beat frequency $\Delta f$ (30 KHz). Therefore, an output signal Sm of the photoelectric element 23 becomes an AC signal which is linearly changed in a phase difference relative to the reference signal SR depending on the amount of displacement of the reticle marks Aua, Aub in the pitch direction on the basis of the reference grating 16.

On the other hand, the interference light BT and the 1st order diffracted lights $D_{11}$, $D_{12}$, all reflected by the beam splitter 20 shown in FIG. 2, reaches the field iris 22. The iris 22 is formed with an opening 22A which allows only the interference light BT to pass therethrough, as shown in FIG. 7B, while the two 1st order diffracted lights $D_{11}$, $D_{12}$ are shielded by a light shielding portion 22B.

The interference light BT having passed through the iris 22 reaches a photoelectric element 26 through a mirror 24 and a condenser lens 25. The photoelectric element 26 produces an output signal Sw depending on change in the intensity of the interference light BT. This output signal Sw also becomes an AC signal of which level is changed sinusoidally at the beat frequency $\Delta f$, the phase of the AC signal relative to the reference signal SR being changed in proportion to the amount of deviation of the mark WMu on the wafer W or the fiducial mark Fu on the fiducial plate FP from the reference grating 16.

The reference signal SR and the output signals Sm, Sw are inputted to a phase difference measurement unit 27 which determines a phase difference $\phi m$ of the output signal Sm relative to the reference signal SR, determines a phase difference $\phi w$ of the output signal Sw relative to the reference signal SR, and further a difference therebetween $\Delta\phi = \phi m - \phi w$. In the case of this embodiment, since the diffraction grating pitch on the fiducial plate FP (or the wafer W) is two times the pitch of the interference fringe produced thereon, one period ($\pm 180°$) of the phase difference $\Delta\phi$ corresponds to $\frac{1}{2}$ ($\pm \frac{1}{4}$ pitch) of the diffraction grating pitch. Based on the phase difference $\Delta\phi$, the measurement unit 27 calculates position correction amounts (or position shift amounts) $\Delta X$, $\Delta Y$ of the water stage ST or the reticle stage RS, values of those amounts being delivered to the main controller 5.

In the foregoing, the system from the driver 10 to the measurement unit 27, including the object lens OBJu, corresponds to first mark detecting means in the present invention.

Meanwhile, in FIG. 2, the mark RMr on the reticle R is detected by a TTR alignment system for exposure (corresponding to $AO_1$ in FIG. 1) which comprises a mirror $M_2$, an object lens OBr, a beam splitter 30, a lens system 31, an illumination field iris 32, a condenser lens 33, a fiber 34, a focusing lens 35, a beam splitter 36, and CCD image sensors 37A, 37B. The fiber 34 emits an illumination light at the exposure wavelength to uniformly irradiate the iris 32 through the condenser lens 33. The illumination light having passed through an opening of the iris 32 enters the object lens OBr through the lens system 31 and the beam splitter 30, following which it is bent by the mirror $M_2$ at a right angle to vertically illuminate a local area of the reticle R including the mark RMr downwards. The iris 32 is conjugate to the reticle R so that an opening image of the iris 32 is focused on the reticle R. The beam splitter 30 is located near a front focus plane of the tele-centric object lens OBr, i.e., a plane conjugate to the pupil EP of the projection lens PL, thereby reflecting a part of the light returned from the object lens OBr toward the focusing lens 35. The CCD image sensors 37A, 37B have their light receiving surfaces which are conjugate to the reticle R through the object lens OBr and the focusing lens 35, and also conjugate to the wafer W or the fiducial plate FP through the projection lens PL. Incidentally, an exit end of the fiber 34 is located to be conjugate to the pupil EP of the projection lens PL for achievement of the Keller's illumination. In the case of this embodiment, the optical path between the object lens OBr and the beam splitter 30 exhibits an afocal system and, therefore, a deviation in the position of the mark RMr can be compensated for by arranging the object lens OBr and the mirror $M_2$ integrally with each other in such a manner as able to move together horizontally in FIG. 2. But, in consideration of stability of the system, the mirror $M_2$ is here fixedly located at a position outside the pattern area PA having the maximum dimension possibly expected on the reticle R.

CCD image sensors 37A, 37B are arranged to have an angular spacing of 90° therebetween so that their horizontal scan lines coincide with the X and Y directions, respectively, for making position measurements of the crossshaped mark RMr in the X and Y directions separately. The reason is to avoid a difference in resolution as developed when using a single CCD image sensor to detect shifts of the mark image in both the horizontal and vertical directions, because a usual CCD image sensor have different degrees of pixel resolution in the horizontal and vertical directions. An image processing unit 38 receives respective image signals (video signals) from the CCD image sensors 37A, 37B, detects a position shift amount of the mark RMr on the reticle R from the fiducial mark FMr on the fiducial plate FP, and then deliver information of the position shift amount to the main controller 5.

In addition to the above configuration, there are also provided a global mark detection system 40 of off-axis type for detecting a global aligment mark on the wafer W, a latent image in a resist layer or the respective fiducial marks on the fiducial plate FP, and a processing unit 42 for processing a signal from the system 40. Furthermore, adjustment units 50A, 50B for adjusting or correcting various focusing characteristics of the projection lens PL are provided and supervised under control of the main controller 5. The adjustment unit 50A has a function of changing magnification, focus position, distortion, etc. of the projection lens PL by, for example, controlling pressure of a predetermined air chamber in the projection lens PL. The adjustment unit 50B has a function of finely moving in the axial direction or tilting a lens element as one component of the projection lens PL (for example, a field lens on the reticle side).

The different wavelength TTR alignment system and the exposure light TTR alignment system are preferably arranged as schematically shown in FIG. 9. As will be seen from FIG. 9, reticle grating mark areas Au, Al, Ar, Ad, each being arranged as shown in FIG. 5, are formed in the respective sides of the light shielding band ESB around the pattern area PA on the reticle R. The mark areas Au, Ad are used for alignment in the X direction plotted in FIG. 9, whereas the mark areas Ar, Al are used for alignment in the Y direction.

Outside the light shielding band ESB, there is also provided a reticle mark RMl similar to the reticle mark RMr at a symmetrical position.

Therefore, object lenses OBr, OBl, of two exposure light TTR alignment systems are arranged to respectively detect the marks RMr, RMl below the dichroic mirror DM, and object lenses OBJu, OBJd, OBJr, OBJl of four different wavelength TTR alignment systems are arranged to respectively detect the mark areas Au, Ad, Ar, Al through the dichroic mirror DM.

When the reticle R and the wafer W are actually aligned with each other on a die-by-die basis by using the different wavelength TTR alignment systems, the four eyes are not always required to be used simultaneously, but three or two eyes may be used instead. This is relied on the fact that even in the case where any of corresponding marks (WMu, WMd, WMr, WMl) in one shot area on the wafer is defective, if one eye in the X direction and one eye in the Y direction at miniumum properly output photoelectric signals, an alignment error (interruption of the sequence) can be avoided to the utmost by executing the alignment for the shot area of interest.

The mark arrangement on the reticle R as shown in FIG. 9 and the mark arrangement on the fiducial plate FP suitable for this embodiment will be next described with reference to FIGS. 10 and 11.

Figure 10:
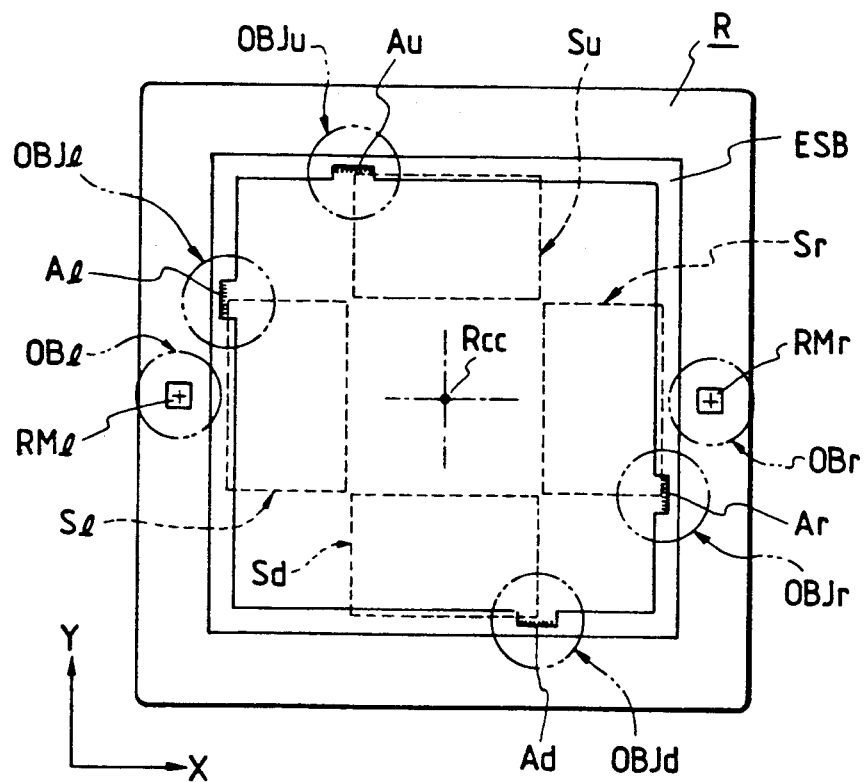
FIG. 10 is a plan view showing a practical pattern arrangement of the reticle.

FIG. 10 shows one preferred example of a pattern layout on the reticle R, in which the pattern area PA having the maximum dimension projectable by the projection lens PL is supposed. The cross-shaped reticle marks RMr, RM are provided on a line passing the center Rcc of the pattern area PA on the reticle R and extending parallel to the X axis. These marks RMr, RMl are set substantially at the respective centers of the view fields of the object lenses OBr, OBl. In the reticle R shown in FIG. 10, the four mark areas Au, Ad, Ar, Al are each located at a position farthest from the reticle center Rcc. Stated otherwise, rectangular areas Su, Sd, Sr, Sl indicated by broken lines in FIG. 10 respectively stand for one examples of ranges where the optical axes (detection centers) of the object lenses OBJu, OBJd, OBJr, OBJl of the four different wavelength TTR alignment systems are movable. Then, in the case of FIG. 10, the mark areas Au, Ad, Ar, Al are each provided at the outermost position of the movable range of the corresponding object lens.

FIG. 10 is illustrated by way of example and, depending on cases, the movable ranges Sr, Sl of the object lenses OBJr, OBJl may protrude into a region between the movable ranges Su, Sd of the object lenses OBJu, OBJd from the right and left.

Figure 11:
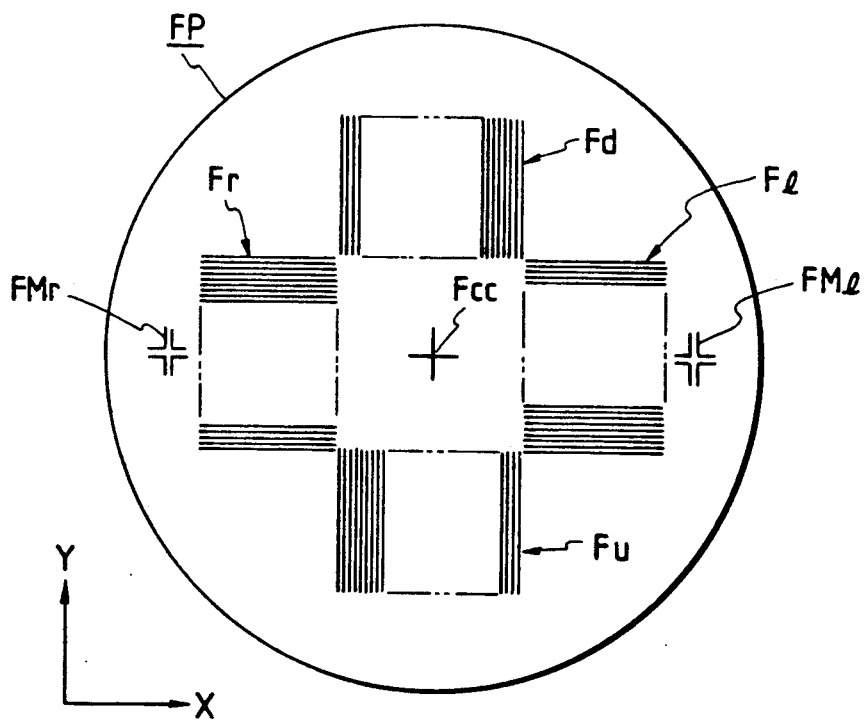
FIG. 11 is a plan view showing a pattern arrangement on a fiducial mark plate.

FIG. 11 shows the mark arrangement on the fiducial plate FP with double cross-shaped fiducial marks FMr, FMl provided on the left and right sides of the center in the X direction. The center-to-center distance between the two fiducial marks FMr and FMl is set equal to a value resulted from multiplying the center-to-center distance between the two marks RMr and RMl on the reticle by the projection magnification (1/M). Accordingly, when the center Fcc of the fiducial plate FP is made coincident with the reticle center Rcc, the fiducial mark FMr and the reticle mark RMr are simultaneously observed by the object lens OBr of one exposure light TTR alignment system under a condition that the reticle mark RMr is positioned between the double lines of the fiducial mark FMr, and the fiducial mark FM and the reticle mark RMl are simultaneously observed by the object lens OBl of the other exposure light TTR alignment system under a condition that the reticle mark RMl is positioned between the double lines of the fiducial mark FMl.

On the fiducial plate FP, there are also provided fiducial mark areas Fu, Fd, Fr, Fl in which diffraction gratings are engraved in positions and sizes respectively corresponding to the movable ranges Su, Sd, Sr, Sl on the reticle R when the center Fcc of the fiducial plate FP is made coincident with the reticle center Rcc. In the fiducial mark area Fu, for example, a group of grating lines engraved in the X direction with the constant pitch are formed similarly to the mark WMu on the wafer W and used for detecting a relative position shift in the X direction from the mark area Au on the reticle R. This equally applies to the other fiducial mark areas Fd, Fr, Fl. Accordingly, even if the size of the pattern area PA (or the light shielding band ESB) is changed upon replacement of the reticle R with another one, it is possible to simultaneously detect an X-directional shift of the mark area Au from the fiducial mark Fu, an X-directional shift of the mark area Ad from the fiducial mark Fd, a Y-directional shift of the mark area Ar from the fiducial mark Fr, and a Y-directional shift of the mark area Al from the fiducial mark Fl by the four eyes (OBJu, OBJd, OBJr, OBJl) so long as the mark areas Au, Ad, Ar, Al on the reticle are present within the movable ranges Su, Sd, Sr, Sl, respectively.

In FIG. 11, the two groups of plural grating lines making up the fiducial marks Fr and Fl on the left and right sides correspond to each other in one-to-one relation with respect to the Y direction, whereas the two groups of plural grating lines making up the fiducial marks Fu and Fd on the upper and lower sides correspond to each other in one-to-one relation with respect to the X direction. Further, the center-to-center spacing in the X direction between the mark area Au and Ad shown in FIG. 10 is accurately equal to integer times as much as the grating pitch of the fiducial marks Fu, Fd, whereas the center-to-center spacing in the Y direction between the mark area Ar and Al is accurately equal to integer times as much as the grating pitch of the fiducial marks Fr, Fl.

Operation of this embodiment, that is, base line measurement of the exposure light TTR alignment system and the different wavelength TTR alignment system in consideration of a distortion, will be described below. At first, an arbitrary reticle (such as shown in FIG. 10, for example) is set on the reticle stage RS and the reticle alignment is performed by picking up images of the reticle marks RMr. RMl and the marks FMr, FMl on the fiducial plate FP by the CCD sensor elements 37A, 37B of the exposure light TTR alignment systems.

Then, the object lenses OBJu, OBJd, OBJr, OBJl (i.e., the holders 11) of the four different wavelength alignment systems are set at positions respectively corresponding to the mark areas Au, Ad, Ar, Al, followed by checking shifts in illumination position of the two beams $L_{m1}$, $L_{m2}$ in the X and Y directions and a telecentric error of the two beams $L_{m1}$, $L_{m2}$ by the use of the fiducial marks Fu, Fd, Fr, Fl on the fiducial plate FP. After completion of the checking, the four different wavelength alignment systems each determines amounts of relative position shifts between the reticle R and the fiducial plate FP at that position. In other words, the shift amounts in the X direction between the fiducial mark Fu (and Fd) and the reticle mark Au (and Ad), as well as the shift amounts in the Y direction between the fiducial mark Fr (and Fl) and the reticle mark Ar (and Al) are detected through the respective measurement units 27.

Based on the detected shift amounts, the main controller 5 controls the driver 1 and the stage driver 4 for servo-driving the reticle stage RS or the wafer stage ST. Since the different wavelength alignment systems of this embodiment are each of the heterodyne type allowing successive measurement of the relative position shift amount even in a condition that the reticle mark and the fiducial mark remain at rest. The measurement units 27 continue successively outputting the information on the relative position shifts (such as in the X, Y and rotating directions). Therefore, the alignment between the reticle R and the fiducial plate FP is continued so that all the phase differences $\Delta\phi$ measured by the measurement units 27 of the four different wavelength alignment systems become zero (or a fixed value). During the above step of the different wavelength alignment, the image processing units 38 of the exposure light TTR alignment systems continue successively (at certain intervals of time) outputting the position shift amounts ($\Delta Xr$, $\Delta Yr$) in the X, Y directions between the reticle mark RMr and the fiducial mark FMr, as well as the position shift amounts ($\Delta Xl$, $\Delta Yl$) in the X, Y directions between the reticle mark RMl and the fiducial mark FMl. It is to be noted that in the case of a large distortion, the corresponding shift amount is added as an offset amount to a design value beforehand. Thus, the shift amounts ($\Delta Xr$, $\Delta Yr$), ($\Delta Xl$, $\Delta Yl$) determined by the exposure light TTR alignment systems correspond to averages of distortion differences at the alignment positions (i.e., the marks Au, Ad, Ar, Al) between the wavelength of the exposure light and the different wavelength therefrom. To put it in more detail, when the results of detecting two pairs of the reticle mark Au (the fiducial mark Fu) and the reticle mark Ad (the fiducial mark Fd) show that the phase differences $\Delta\phi$ therebetween are both zero, the shift amounts ($\Delta Xr$, $\Delta Yr$), ($\Delta Xl$, $\Delta Yl$) detected by the image processing units 38 are stored plural times, following which the stored results are averaged to determine overall alignment errors (in X, Y and $\theta$ directions) caused by a distortion difference between the reticle R and the fiducial plate FP. In the case of this embodiment, the reticle R and the fiducial plate FP are simultaneously aligned with each other by using four eyes of the different wavelength TTR alignment systems, the reticle R and the fiducial plate FP exhibit, as a consequence of the alignment, slight errors in the X, Y and $\theta$ directions depending on distortion characteristics of the projection lens PL at the different wavelength. These errors can be assumed as fixed offsets so long as the reticle marks Au, Ad, Ar, Al are not changed in their positions. Therefore, by detecting the shift amounts between the marks RMr, RMl and the fiducial marks FMr, FMl using the exposure light TTR alignment systems, the resulting shift amounts give offset amounts in the X, Y and θ directions which include the distortion amounts of the projection lens at the positions of the marks RMr, RMl under the exposure light.

Accordingly, when actually carrying out alignment of the shot area on the wafer W by the different wavelength TTR alignment systems thereafter, it is only required to control the reticle stage RS or the wafer stage ST so that the aligned position is shifted by the above offset amounts to reach the true alignment position. The offset amounts caused by the distortion difference in the X, Y and θ (rotating) directions are calculated in the main controller 5 based on information of the shift amounts from the image processing unit 38, and stored until the reticle R will be realigned or replaced with another one.

As the distortion difference in the projection lens PL between the wavelength of the exposure light and the different wavelength therefrom may be changed upon the adjustment unit 50B being actuated, it is desirable that immediately after actuating the adjustment unit 50B to a large extent, the offset amounts are measured again by using the fiducial plate FP.

With this embodiment as stated above, since the mark areas Au, Ad, Ar, Al for the different wavelength TTR alignment are respectively provided on the four sides of the reticle R and the corresponding fiducial marks Fu, Fd, Fr, Fl on the fiducial plate FP are simultaneously detected, it is possible to precisely determine the overall alignment errors through TTR which are caused by an influence of distortions at the different wavelength. Further, with this embodiment, since the different wavelength TTR alignment systems and the exposure light TTR alignment systems are simultaneously operated through the projection lens PL and the values measured by the interferometer 3 on the wafer stage ST are not used at all, errors due to fluctuating air in the atmosphere, which would raise a problem associated with the interferometer 3, will not be involved so that the offset amounts can be measured with very high precision.

In addition, since this embodiment employs the different wavelength TTR alignment systems of heterodyne type having extremely high resolution, the highly accurate measurement is achieved. For example, assuming that the pitch of the diffraction gratings on the fiducial plate FP is on the order of 4 μm, the phase difference detectable range ($\pm 180°$) is given $\pm 1$ μm. Also, assuming that the practical phase measurement resolution is $\pm 2°$ in consideration of noises and so on, the position shift detecting resolution becomes as high as about $\pm 0.01$ μm.

Consequently, with such an arrangement that the reticle R and the fiducial plate FP are subjected to alignment servo control by using the different wavelength TTR alignment systems of heterodyne type, the highly stable positioning can be achieved.

While the projection lens PL of this embodiment has been explained as being tele-centric on both sides thereof, it may of course be tele-centric on either side only. In the case of a projection lens being tele-centric on both sides, the optical axis of the object lens of the exposure light TTR alignment system is vertical to the reticle surface and also coincident with the principal ray passing the pupil center of the projection lens PL. Therefore, if the mark patterns on the reticle are formed of reflective chromium layers, the light regularly reflected by the patterns are so strongly detected by the CCD image sensors that both the reticle mark RMr, RMl and the fiducial mark FMr, FMl may appear bright. In the case where the fiducial plate FP made of quartz glass or the like is entirely covered with a chromium layer and the fiducial marks FMr, FMl are formed by removing the chromium layer by etching or the like into desired patterns, it may happen that the fiducial marks FMr, FMl look black, but the whole of the surroundings become bright, thereby greatly lowering the contrast of the reticle marks RMr, RMl. In this case, an aperture iris (spatial filter) having a ring-shaped opening may be disposed in the illumination optical path of each exposure light TTR alignment system, e.g., in the pupil conjugate plane between the beam splitter 30 and the lens system 31 in FIG. 2, for illuminating the reticle R in the dark field. With this arrangement, dark field images are focused on the CCD image sensors such that only respective edges of the reticle marks RMr, RMl and the fiducial marks FMr, FMl glint brightly. Moreover, the spatial filter disposed in the pupil conjugate plane may be formed of a liquid crystal, electro-chromic (EC) or the like in which multiple ring-like openings are patterned in concentric relation, allowing the illumination to be switched between the dark field and the light field. It is also possible to change the number of aperture for the illumination light.

A manner of improving superposition accuracy when using the apparatus as shown in FIG. 2, in particular, a manner of improving the matching between different units of the apparatus, will be described below.

Figure 12C:
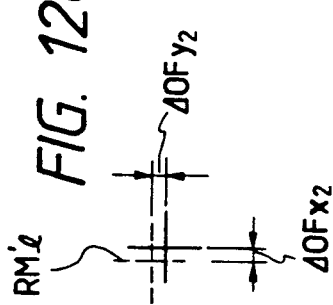
FIGS. 12A to 12C are views showing distortion characteristics at the wavelength of an exposure light and a different wavelength.
Figure 12A:
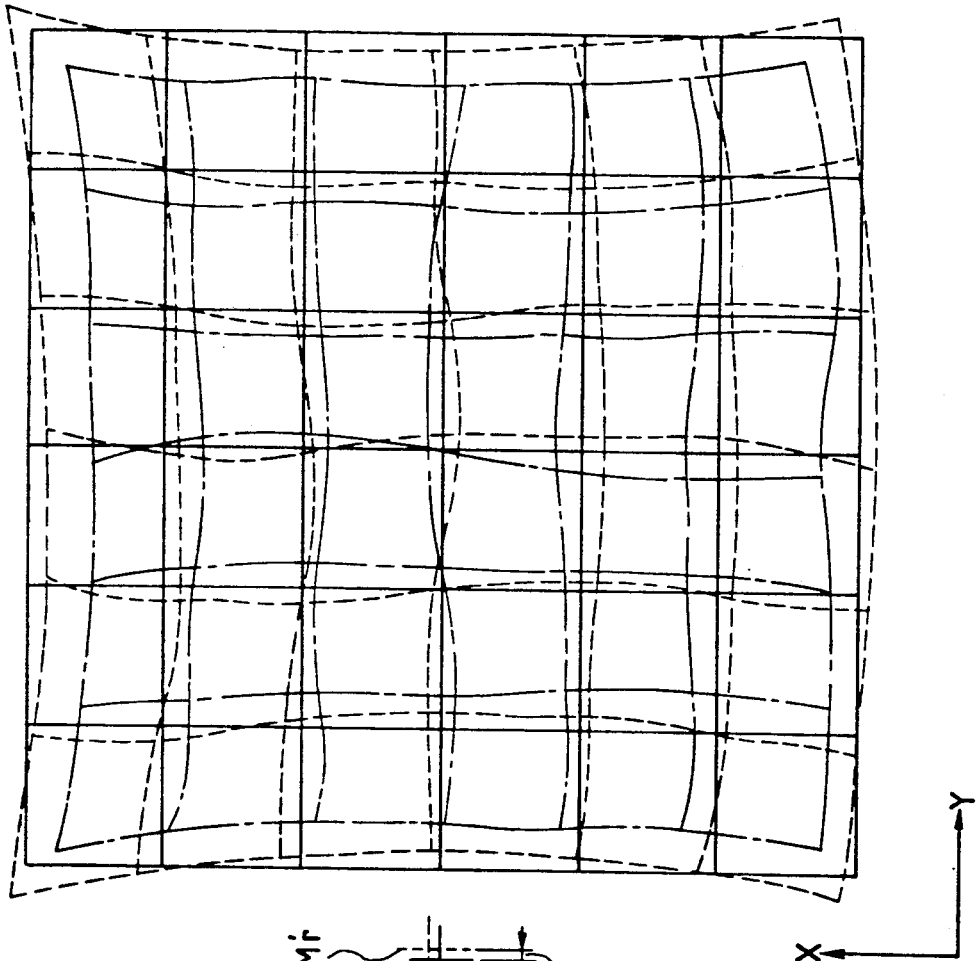

FIG. 12A exaggeratedly represents distortion characteristics (broken lines) of the projection lens PL under the exposure wavelength and distortion characteristics (one-dot-chain lines) thereof under the different wavelength (i.e., the wavelength of the alignment light) on the basis of an ideal lattice (solid lines).

A distortion map like that can be drawn by, for example, making a trial print using a test reticle. Note that the distortion map under the different wavelength cannot be obtained by the trial printing, but can be obtained by using the method similar to the above stated embodiment in a combined manner.

At first, a test reticle having vernier marks for superposition measurement at respective ideal lattice points in the pattern area is prepared and aligned by the exposure light TTR alignment system. Then, a reticle blind in the exposure illumination system is fully opened and the test reticle is exposed onto a dummy wafer (such as a photosensitive resist layer, photo-chromic layer or bare silicon wafer coated with an opto-magnetic medium).

Next, the reticle blind is narrowed so as to illuminate only the vernier mark provided at the center of the test reticle. Following that, while stepping the wafer stage ST at the pitch of the ideal lattice points, an exposure is made in superposed relation to each latent image of the vernier mark on the test reticle having been exposed in advance on a step-by-step basis.

In this case, on assumptions that the stepping of the wafer stage ST is coincident with the division pitch of the ideal lattice, the distortion characteristics under the exposure wavelength on the basis of the ideal lattice can be determined by measuring the superposition accuracy between the latent image of each vernier mark exposed at the first time and the latent image of the same vernier mark printed at the second time in superposing relation. In the above measurement, the latent images of the vernier marks on the dummy wafer may be detected by the global mark detection system 40 of off-axis type shown in FIG. 2, or by the exposure light TTR alignment system after properly modifying a shape of the vernier mark. Where the dummy wafer is formed of a usual photoresist layer, the measurement may be performed by the different wavelength TTR alignment system, etc. after once developing the dummy wafer to build resist images of the vernier marks.

Figure 12B:
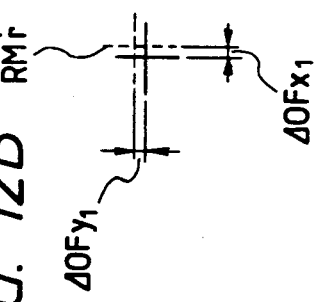

Then, amounts of superposition errors are determined at each of the ideal lattice points in that way, and the resulting error amounts are statistically processed by the method of least squares for determining the respective offsets in the X, Y and θ directions. Based on those offsets, the shift amounts ($\Delta OF_{x1}$, $\Delta OF_{y1}$), ($\Delta OF_{x2}$, $\Delta OF_{y2}$) of the images RMr', RMl' of the reticle marks RMr, RMl under the exposure wavelength, indicated by broken lines in FIGS. 12B and 12C, from the ideal positions (solid lines) can be presumed as system offsets.

Consequently, when aligning the reticle marks RMr, RMl by the exposure light TTR alignment systems, it is possible to always make an exposure on the distortion map with the least errors from the ideal lattice, by taking into account the system offsets.

Further, since the difference in distortion between the exposure wavelength and the different wavelength can be determined following the above first embodiment, the reticle pattern can be exposed in superposed relation to each shot area on the wafer under a condition closest to the ideal lattice, by further taking into account (or compensating for) the distortion difference, even in the case of die-by-die alignment using the different wavelength TTR alignment systems. This implies that the matching between different units of plural steppers jointly constituting a single semiconductor manufacture line can be achieved on the order of the ideal lattice, and hence that the matching accuracy in the manufacture line can be improved.

Since the above embodiment is premised on using the stepper shown in FIG. 2, the detection center of the exposure light TTR alignment system is fixedly positioned in the view field of the projection lens. Therefore, after determining and compensating for the system offsets ($\Delta OF_{x1}$, $\Delta OF_{y1}$), ($\Delta OF_{x2}$, $\Delta OF_{y2}$) during the reticle alignment beforehand so that the distortion map under the exposure wavelength becomes closest to the ideal lattice, as explained in connection with FIGS. 12B and 12C, distortion errors under the different wavelength may be determined at each alignment position using the different wavelength TTR alignment system.

According to the present invention, as described above, since a different wavelength TTR alignment system and an exposure light TTR alignment system are arranged to be separated from each other and to simultaneously detect a group of fiducial marks located on the image plane of a projection optical system, the distortion difference as developed in when using the different wavelength can be precisely measured. In other words, since the alignment light at the exposure wavelength and the alignment light at the different wavelength are detected by the respective TTR alignment systems exactly at the same timing through the projection optical system, the detected results commonly include measurement errors due to minute fluctuations in air flows, temperature distribution, etc. within the optical paths, thereby allowing those measurement errors to be canceled out. Another advantage is in that since the present invention does not rely on the method using a laser interferometer while running a wafer stage or the like, the results will not be affected by measurement accuracy (reproducibility) of the laser interferometer itself.

Further, according to the present invention, since a plurality of TTR alignment systems can be simultaneously operated using the group of fiducial marks, it is also possible to implement beam positioning, tele-centric checking and focus checking at the same time, which are necessary upon the an object lens of the TTR alignment system being moved, resulting in an advantage of increasing a throughput in setting of the TTR alignment system.

I claim:

1. A projection optical apparatus comprising:
    a projection optical system for projectively focusing a pattern image of a mask under illumination by a light of first wavelength characteristic onto a sensitive substrate,
    a stage for holding said sensitive substrate,
    a fiducial plate disposed on said stage,
    first mark detection means for illuminating a light of second wavelength characteristic different from said first wavelength characteristic, through a first mark area formed on said mask and said projection optical system, onto said sensitive substrate or a second mark area formed on said fiducial plate, and then detecting optical information produced from said second mark area,
    a fourth mark area formed on said sensitive substrate or said fiducial plate and arranged in a predetermined positional relationship relative to said second mark area,
    a third mark area formed on said mask and arranged in a predetermined positional relationship relative to said first mark area,
    second mark detection means for illuminating said light of first wavelength characteristic onto said fourth mark area through said third mark area and said projection optical system, and then detecting optical information produced from said fourth mark area, under a condition that said first mark detection means is detecting the optical information produced from said second mark area, and
    error detection means for detecting detection errors due to a distortion at respective positions in the view field of said projection optical system where said first mark area and said second mark area are present, based on the detected results by said first mark detection means and said second mark detection means.

2. A projection optical apparatus according to claim 1, wherein:
    said first mark detection means has a first object lens system movable depending on position change of said first mark area on said mask, and
    the uniform mark pattern is formed in said second mark area over a movable range of said first object lens system.

3. A projection optical apparatus comprising:
    a projection optical system disposed between first and second planes such that said first and second planes are optically conjugate to each other under a first wavelength characteristic, alignment mark means including first and second mark means disposed on said first plane with a predetermined positional relationship therebetween, and third and fourth mark means disposed on said second plane with a predetermined positional relationship therebetween;

first mark detection means for illuminating a light of second wavelength characteristic different from said first wavelength characteristic onto said second mark means through said first mark means and said projection optical system, and then detecting first optical information produced from said second mark means, second mark detection means for illuminating said light of first wavelength characteristic onto said fourth mark means through said third mark means and said projection optical system, and then detecting second optical information produced from said fourth mark means, and means for creating information of alignment errors developed between said first and second planes in the directions enough to define a plane, based on said first and second optical information.

* * * * *

UNITED STATES PATENT AND TRADEMARK OFFICE
CERTIFICATE OF CORRECTION

PATENT NO. : 5,138,176
DATED      : August 11, 1992
INVENTOR(S): Kenji NISHI

It is certified that error appears in the above-identified patent and that said Letters Patent is hereby corrected as shown below:

```
Column 19:
   Claim 3, line 6, "second" should read --third--;
           line 9, "third" should read --second--.
```

Signed and Sealed this

Twenty-third Day of November, 1993

Attest:

BRUCE LEHMAN

Attesting Officer

Commissioner of Patents and Trademarks